United States Patent [19]
Carroll et al.

[11] Patent Number: 5,444,421
[45] Date of Patent: Aug. 22, 1995

[54] LOW POWER CONSUMPTION OSCILLATOR USING MULTIPLE TRANSCONDUCTANCE AMPLIFIERS

[75] Inventors: Gary T. Carroll, Boulder; J. Donald Pauley, Estes Park, both of Colo.

[73] Assignee: Racom Systems, Inc., Englewood, Colo.

[21] Appl. No.: 195,162

[22] Filed: Feb. 10, 1994

[51] Int. Cl.⁶ .......................................... H03K 3/0231
[52] U.S. Cl. ................... 331/111; 331/108 D; 331/143
[58] Field of Search ............ 331/111, 143, 108 D

[56] References Cited

U.S. PATENT DOCUMENTS 4,564,821  1/1986  Reichart ................. 331/179 X
5,093,634  3/1992  Khoury .................. 331/111 X

OTHER PUBLICATIONS

Ramtron Corporation, R2 92490, Ramtron Brochure, RTx 0801 Ramtag ™, 256-Bit Passive Nonvolatile RF/ID Tag Engineering Prototype, 1990, pp. 1–6.
Ramtron International Corporation, Ramtron Brochure, FM1208S FRAM® Memory, 4,096-Bit Nonvolatile Ferroelectric RAM Product Specification, R3 Aug., 1993, pp. 1–8.

Primary Examiner—Siegfried H. Grimm
Attorney, Agent, or Firm—Peter J. Meza; William J. Kubida; Holland & Hart

[57] ABSTRACT

An oscillator circuit includes a multiple output transconductance amplifier having a positive voltage input, a negative voltage input, and three current outputs. A first current output is coupled to the positive input, a second current output is coupled to the negative input, and a third current output provides the full logic voltage oscillator output signal. A resistor network is coupled to the positive voltage input of the transconductance amplifier. The first current output is used to generate a square wave signal at the positive voltage input. A capacitor is coupled to the negative voltage input of the transconductance amplifier. The second current output is used to generate a triangle wave signal at the negative voltage input. Both the square wave and triangle wave have a mean DC level centered halfway between the power supply rails of the transconductance amplifier. The differential voltage between the positive and negative inputs is sensed and converted into a full logic voltage oscillator output signal with the unloaded third current output. If desired, three separate transconductance amplifiers can be used in place of the multiple output transconductance amplifier.

17 Claims, 3 Drawing Sheets

LOW POWER CONSUMPTION OSCILLATOR USING MULTIPLE TRANSCONDUCTANCE AMPLIFIERS

CROSS REFERENCE TO RELATED APPLICATIONS

The present invention is related to the inventions described in the following U.S. patent applications:

Ser. No. 08/194,616, entitled "Passive RF Transponder and Method";

Ser. No. 08/194,694, entitled "Integrated Asynchronous FSK Detector and Method";

Ser. No. 08/194,723, entitled "Communications System Utilizing FSK/PSK Modulation Techniques";

Ser. No. 08/194,708, entitled "FSK Detector Circuit and Method"; and

Ser. No. 08/194,707, entitled "Power Supply and Power Enable Circuit for an RF/ID Transponder", all of which applications are filed concurrently herewith and assigned to the assignee of the present invention, the disclosures of which are hereby specifically incorporated by this reference.

BACKGROUND OF THE INVENTION

This invention relates generally to oscillator circuits. More particularly, the present invention relates to a low power consumption oscillator circuit for an integrated circuit having transconductance amplifiers as the basic building blocks of the design.

Numerous types of oscillator circuit designs are well known in the art. Not all of these circuits, however, are suited for a low power integrated circuit application. Undesirable characteristics in prior art designs include excessive power consumption, complexity of design resulting in high component count and correspondingly large integrated circuit die area, as well as high sensitivity of the oscillator frequency to fluctuations in the power supply voltage.

What is desired, therefore, is an oscillator circuit design that is simple, consumes relatively little power, and provides an oscillator frequency that is substantially invariant with respect to changes in power supply voltage.

SUMMARY OF THE INVENTION

It is, therefore, a principal object of the present invention to provide an oscillator design that is easily fabricated as an integrated circuit.

It is another object of the invention to provide a low power consumption oscillator circuit suitable for low power integrated circuit applications.

It is an advantage of the invention that the oscillator frequency is relatively invariant with respect to power supply voltage fluctuations.

According to a first embodiment of the present invention, an oscillator circuit includes a multiple output transconductance amplifier having a positive voltage input, a negative voltage input, and three current outputs. A first current output is coupled to the positive input, a second current output is coupled to the negative input, and a third current output provides the full logic voltage oscillator output signal. A resistor network is coupled to the positive voltage input of the transconductance amplifier. The first current output is used to generate a square wave signal at the positive voltage input. A capacitor is coupled to the negative voltage input of the transconductance amplifier. The second current output is used to generate a triangle wave signal at the negative voltage input. Both the square wave and triangle wave have a mean DC level centered halfway between the power supply rails of the transconductance amplifier. The differential voltage between the positive and negative inputs is sensed and converted into a full logic voltage oscillator output signal at the unloaded third current output. In a second embodiment, three separate transconductance amplifiers are used each having a differential voltage input and a single current output.

The foregoing and other objects, features and advantages of the invention will become more readily apparent from the following detailed description of a preferred embodiment of the invention which proceeds with reference to the accompanying drawings.

DETAILED DESCRIPTION

Figure 1:
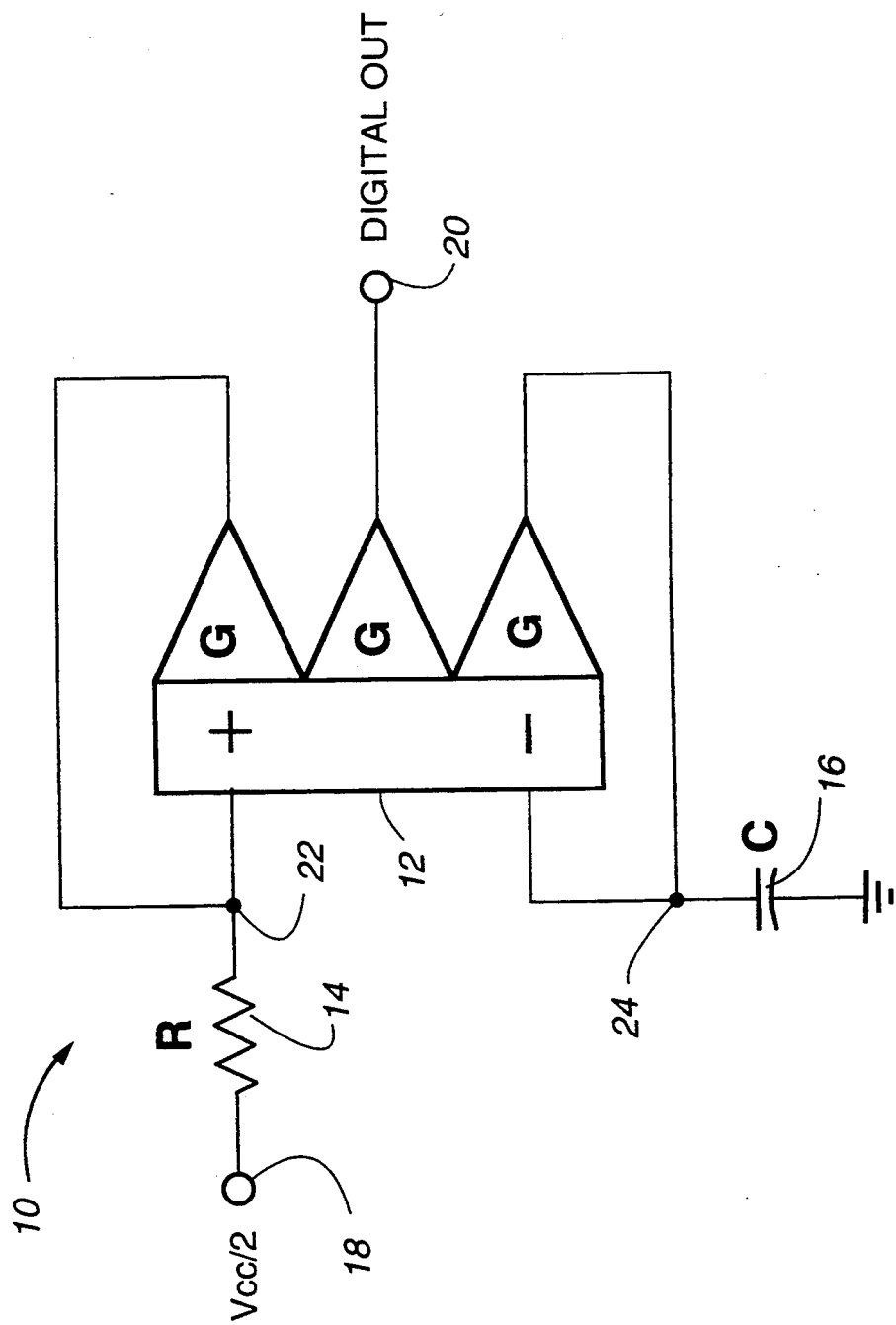
FIG. 1 is a schematic drawing of an oscillator circuit according to a first embodiment of the invention including a multiple output transconductance amplifier.

Referring now to FIG. 1, an oscillator circuit 10 includes a single transconductance amplifier 12 having a positive voltage input coupled to circuit node 22, a negative voltage input coupled to circuit node 24, and three current outputs. Amplifier 12 is termed a transconductance amplifier because, by definition, a current output is generated in response to the differential voltage sensed between the positive and negative voltage inputs of the amplifier. The transconductance of each of the current outputs of transconductance amplifier 12 is substantially equal. Note that transconductance amplifier 12 has a single input section and three current outputs. The exact circuit implementation of amplifier 12, therefore, could take advantage of this fact and be designed with a single input section that provides the input for three separate output sections.

In oscillator circuit 10, a first current output of amplifier 12 is coupled to the positive input at circuit node 22, a second current output of amplifier 12 is coupled to the negative input at circuit node 24, and a third current output of amplifier 12 provides an oscillator output signal at circuit node 20. A resistor 14 is coupled between circuit node 22 and circuit node 18. Circuit node 18 receives a reference voltage of Vcc/2, which is the power supply voltage for the transconductance amplifier divided by two. A capacitor 16 is coupled between circuit node 24 and ground.

Figure 2:
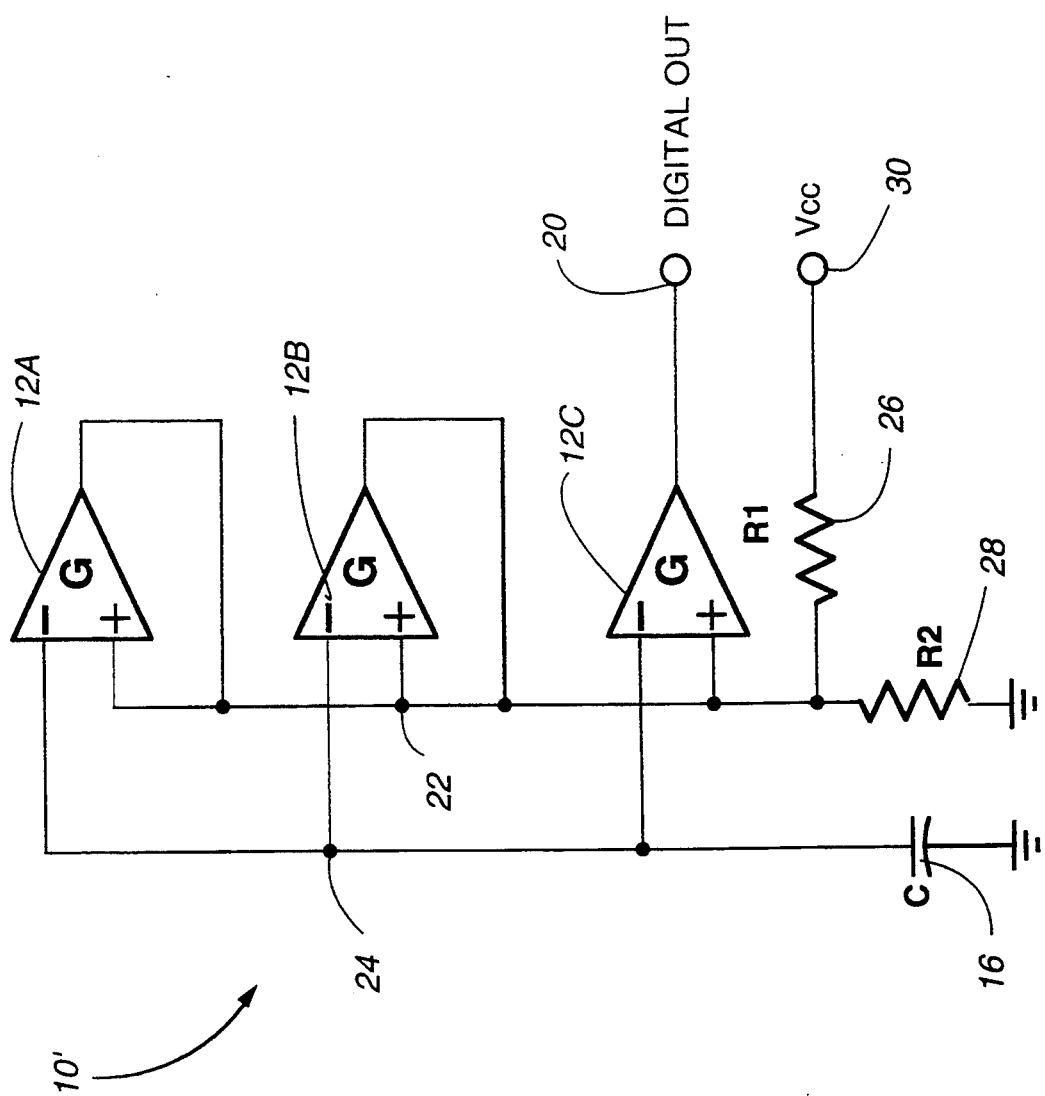
FIG. 2 is a schematic drawing of an oscillator circuit according to a second embodiment of the invention including three separate transconductance amplifiers each having a single output.

Referring now to FIG. 2, an alternative oscillator circuit 10' includes three separate single-output transconductance amplifiers 12A, 12B, and 12C in place of the single transconductance amplifier 12 in oscillator circuit 10 of FIG. 1. Note that each amplifier 12A–12C is a self-contained transconductance amplifier having a differential voltage sensing input and a single-ended current output. The transconductance of each of the transconductance amplifiers 12A through 12C is substantially equal.

In oscillator circuit 10' a first transconductance amplifier 12A has a positive voltage input coupled to circuit node 22, a negative voltage input coupled to circuit node 24, and a current output coupled to the positive input at circuit node 22. A second transconductance amplifier 12B has a positive voltage input coupled to circuit node 22, a negative voltage input coupled to circuit node 24, and a current output coupled to the negative input at circuit node 24. A third transconductance amplifier also has a positive voltage input coupled to circuit node 22, a negative voltage input coupled to circuit node 24, and has a current output for providing a square wave oscillator output signal at circuit node 20. Thus, each of the positive inputs of the transconductance amplifiers are coupled together at node 22 and each of the negative inputs of the transconductance amplifiers are coupled together at node 24. A resistor network including a first resistor 26 is coupled between node 22 and the Vcc supply voltage at node 30. A second resistor 28 is coupled between node 22 and ground. The value of resistors 26 and 28 are substantially equal. Resistors 26 and 28 form a voltage divider that centers the DC component of the square wave on node 22 at a voltage equal to Vcc/2. Resistors 26 and 28 form an alternative resistive circuit to the single resistor 14 coupled to the reference voltage at node 18 in FIG. 1, but provide the same basic reference and load function. Thus either resistor network can be used in oscillator 10 or 10'. As in the previous embodiment, a capacitor 16 is coupled between circuit node 24 and ground.

In operation, oscillator circuit 10 or 10' generates a square wave at circuit node 22 and a triangle wave at circuit node 24, wherein the frequencies of the square wave and the triangle wave are the same, such that the peaks of the triangle wave occur at the positive and negative going transitions of the square wave. The individual voltage components of the differential voltage at circuit nodes 22 and 24 are then compared and converted into a single-ended square wave oscillator output signal.

Figure 3:
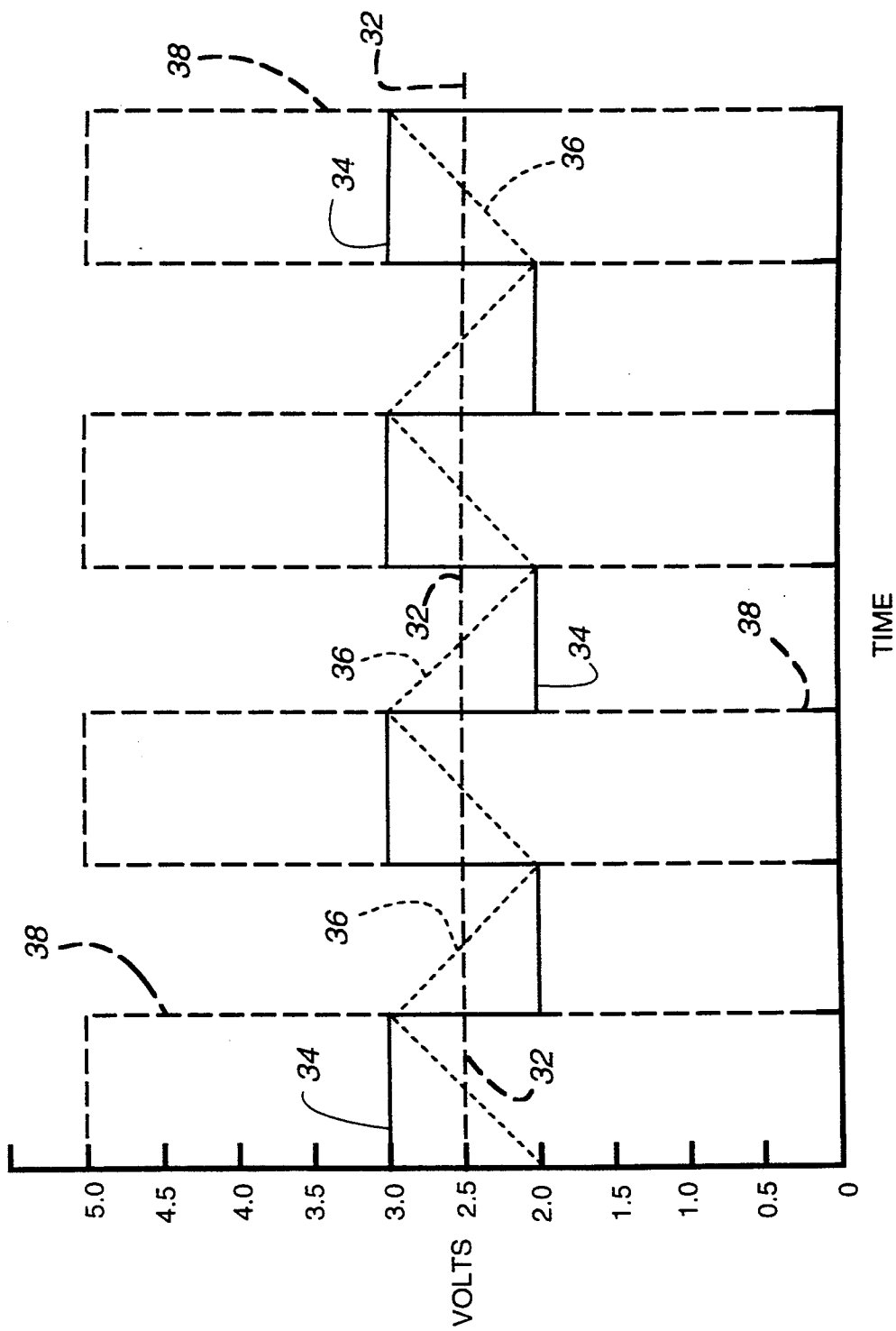
FIG. 3 is a timing diagram associated with the oscillator circuits of both FIGS. 1 and 2.

Referring now to FIG. 3, a timing diagram is shown illustrating a square wave signal 34, a triangle wave signal 36, and an output signal 38 associated with oscillator circuits 10 and 10'. A first DC voltage level 32 represented by relatively large dashed line segments is shown in FIG. 3, which represents the DC potential (Vcc/2=2.5 volts) on circuit node 22, regardless of the resistor network used. Level 32 is also the mean DC potential associated with square wave 34, represented with solid line segments, and triangle wave 36, which is represented with relatively small dashed line segments. The final output waveform 38 is a square wave with full logic voltage swings between Vcc and circuit ground. Note that square wave 34 and triangle wave 36 have the same potential and, in FIG. 3, have a voltage swing of about one volt peak-to-peak. The representation of signals 34 and 36 in FIG. 3 is purely arbitrary and may be set to any voltage less than or equal to the power supply voltage that is desired, such as two volts or three volts peak-to-peak.

Referring again to FIG. 2, transconductance amplifier 12A senses the differential voltage between nodes 22 and 24 and generates a current in response to this differential voltage. The current output is directed to resistor 14 or resistor divider 26, 28 to generate a square wave 34 having a mean DC value of Vcc/2. Similarly, transconductance amplifier 12B also senses the differential voltage between nodes 22 and 24 and generates a current in response to the differential voltage. The current output is directed to capacitor 16 to generate a triangle wave 36 having a mean DC value of Vcc/2, with the same amplitude as the square wave 34. A third transconductance amplifier 12C converts the differential voltage between nodes 22 and 24 into a single-ended square wave oscillator output signal 38. If lightly loaded or unloaded, the voltage swing on transconductance amplifier 12C will result in full power supply rail swings. With a five volt Vcc power supply and zero volt ground rails, this represents full CMOS logic swings.

It can be shown that the frequency of oscillation is equal to ($\frac{1}{4}$RC), wherein R is the value of resistor 14 or the parallel resistance of resistors 26 and 28. Note that frequency of oscillation depends only on the value of resistors and capacitors, and is substantially invariant with respect to fluctuations in the Vcc power supply voltage. Also, the power dissipation of the oscillator is determined largely by the current driving requirements of resistor 14 and capacitor 16. Since waveforms 34 and 36 can be made fairly small, the corresponding current is also kept low, as is the power dissipation of the oscillator circuits 10 and 10'. Temperature insensitivity can be accomplished if the frequency setting resistor 14 and capacitor 16 have a low temperature coefficient or inverse temperature coefficients.

A simple design having only a single three output transconductance amplifier 12 or three separate transconductance amplifiers 12A–12C has been shown that is easily fabricated on an integrated circuit. If oscillator 10 is used, a custom integrated circuit can be designed having a single input section or transistor pair and three separate output sections. If oscillator 10' is used, a custom integrated circuit can be used, or the entire oscillator can be fabricated from discrete components or commercially available integrated circuits. For example, a CA3060 integrated circuit array includes three transconductance amplifiers on a single integrated circuit and is ideal for practicing the present invention. The CA3060 is manufactured by Harris Corporation of Melbourne, Fla.

As stated above, oscillator circuits 10 and 10' are ideally suited for low power integrated circuit applications such as are found in the portable RF/ID transponder described in detail in the copending patent application entitled "Integrated Asynchronous FSK Detector and Method" Ser. No. 08/194,694, as well as other copending patent applications, particularly as an alternative circuit to the gated oscillator described therein, or for any other application in which a low power oscillator is needed.

Having described and illustrated the principles of the invention in a preferred embodiment thereof, it is appreciated by those having skill in the art that the invention can be modified in arrangement and detail without departing from such principles. For example, the exact values of resistors 14, 26, and 28, and capacitor 16 can be easily adjusted as needed for modifying power supply consumption and oscillator frequency requirements. Nominal values are entirely dependent upon the nominal oscillator freuquency that is desired. Also, the exact transconductance of the transconductance amplifiers 12, and 12A–12C can be easily modified to control the amplitude of the square wave and triangle wave, which affects power dissipation. We therefore claim all modifications and variations coming within the spirit and scope of the following claims.

What is claimed is:

1. An oscillator circuit comprising:
   a transconductance amplifier having a positive input, a negative input, a first current output coupled to the positive input, a second current output coupled to the negative input, and a third current output for providing an oscillator output signal;
   a resistor network coupled to the positive input of the transconductance amplifier; and
   a capacitor coupled to the negative input of the transconductance amplifier.

2. An oscillator circuit as in claim 1 in which the transconductance of each of the current outputs is substantially equal.

3. An oscillator circuit as in claim 1 in which the resistor network comprises a resistor coupled between the positive input of the transconductance amplifier and a source of reference voltage.

4. An oscillator circuit as in claim 3 in which the reference voltage is substantially equal to the value of a supply voltage divided by two.

5. An oscillator circuit as in claim 1 in which the resistor network comprises:
   a first resistor coupled between the positive input of the transconductance amplifier and a source of supply voltage; and
   a second resistor coupled between the positive input of the transconductance amplifier and ground.

6. An oscillator circuit as in claim 5 in which the values of the first and second resistors are substantially equal.

7. An oscillator circuit as in claim 1 in which the capacitor is coupled between the negative input of the transconductance amplifier and ground.

8. An oscillator circuit comprising:
   a first transconductance amplifier having a positive input, a negative input, and a current output coupled to the positive input;
   a second transconductance amplifier having a positive input, a negative input, and a current output coupled to the negative input;
   a third transconductance amplifier having a positive input, a negative input, and a current output for providing an oscillator output signal,
   wherein each of the positive inputs of the transconductance amplifiers are coupled together at a first node and each of the negative inputs of the transconductance amplifiers are coupled together at a second node;
   a resistor network coupled to the first node; and
   a capacitor coupled to the second node.

9. An oscillator circuit as in claim 8 in which the transconductance of each of the transconductance amplifiers is substantially equal.

10. An oscillator circuit as in claim 8 in which the resistor network comprises a resistor coupled between the positive input of the transconductance amplifier and a source of reference voltage.

11. An oscillator circuit as in claim 10 in which the reference voltage is substantially equal to the value of a supply voltage divided by two.

12. An oscillator circuit as in claim 8 in which the resistor network comprises:
   a first resistor coupled between the first node and a source of supply voltage; and
   a second resistor coupled between the first node and ground.

13. An oscillator circuit as in claim 12 in which the values of the first and second resistors are substantially equal.

14. An oscillator circuit as in claim 8 in which the capacitor is coupled between the second node and ground.

15. An oscillation method comprising the steps of:
   sensing the differential voltage between first and second circuit nodes;
   generating a current in response to the differential voltage with a first transconductance amplifier and directing the current into a resistor coupled to the first circuit node;
   generating a current in response to the differential voltage with a second transconductance amplifier and directing the current into a capacitor coupled to the second circuit node; and
   converting the differential voltage between the first and second circuit nodes into a single-ended square wave oscillator output signal with a third transconductance amplifier.

16. An oscillation method as in claim 15 in which the converting step comprises the step of generating full logic voltage levels in the oscillator output signal with an unloaded output of the third transconductance amplifier.

17. An oscillator circuit comprising:
   a transconductance amplifier having a first input, a second input, a first output coupled to the first input, a second output coupled to the second input, and a third output for providing an oscillator output signal;
   a resistor network coupled to the first input of the transconductance amplifier; and
   a capacitor coupled to the second input of the transconductance amplifier.

* * * * *